United States Patent
Tanaka et al.

(10) Patent No.: US 7,485,939 B2
(45) Date of Patent: Feb. 3, 2009

(54) SOLID-STATE IMAGING DEVICE HAVING A DEFECT CONTROL LAYER AND AN INVERSION LAYER BETWEEN A TRENCH AND A CHARGE ACCUMULATING AREA

(75) Inventors: Shouzi Tanaka, Nara-ken (JP); Ryohei Miyagawa, Kyoto-fu (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 11/435,098

(22) Filed: May 17, 2006

(65) Prior Publication Data
US 2006/0261386 A1 Nov. 23, 2006

(30) Foreign Application Priority Data
May 19, 2005 (JP) ............................. 2005-146488

(51) Int. Cl.
*H01L 27/146* (2006.01)
(52) U.S. Cl. ................ 257/446; 257/291; 257/292; 257/294; 257/463; 257/E27.133
(58) Field of Classification Search ................. 257/446, 257/463, E27.133; *H01L 27/146*
See application file for complete search history.

(56) References Cited
U.S. PATENT DOCUMENTS
2002/0017655 A1* 2/2002 Fujisawa et al. ............ 257/184

| 2004/0178430 | A1* | 9/2004 | Rhodes et al. | 257/292 |
| 2005/0230720 | A1* | 10/2005 | Miyagawa et al. | 257/292 |
| 2007/0052056 | A1* | 3/2007 | Doi et al. | 257/462 |
| 2007/0069260 | A1* | 3/2007 | Stevens | 257/292 |
| 2007/0069321 | A1* | 3/2007 | Hwang | 257/462 |

FOREIGN PATENT DOCUMENTS
JP 11-074499 3/1999

OTHER PUBLICATIONS
Rech, I. et al. "A New Approach to Optical Crosstalk Modeling in Single-Photon Avalanche Diodes". IEEE Photonics Technology Letters, vol. 20, No. 5, pp. 330-332. Mar. 1, 2008.*

* cited by examiner

*Primary Examiner*—Davienne Monbleau
*Assistant Examiner*—Christopher M Roland
(74) *Attorney, Agent, or Firm*—McDermott Will & Emery LLP (57) ABSTRACT

An inversion layer is formed in a part as a boundary between (a) a defect control layer formed along a trench surface for isolating pixel calls and (b) a photo diode. The defect control layer is a P-type, and the photo diode and the inversion layer are N-type. Here, an impurity concentration in the inversion layer is at least twice as high as an impurity concentration in the photo diode.

2 Claims, 11 Drawing Sheets

SOLID-STATE IMAGING DEVICE HAVING A DEFECT CONTROL LAYER AND AN INVERSION LAYER BETWEEN A TRENCH AND A CHARGE ACCUMULATING AREA

CROSS-REFERENCE TO RELATED APPLICATIONS

This application is based on application No. 2005-146488 filed in Japan, the contents of which are hereby incorporated by reference.

BACKGROUND OF THE INVENTION (1) Field of the Invention

The present invention relates to a solid-state imaging device and a manufacturing method of the same, and particularly to a technique for miniaturizing pixel cells that make up a solid-state imaging device.

(2) Description of the Related Art

In recent years, needs for high-pixelization of solid-state imaging devices have been increasing. To meet these needs for high-pixelization, a miniaturization of pixel cells that make up a solid-state imaging device has been advanced. As a result, it became difficult to separate pixel cells by local oxidation of silicon isolation (LOCOS) when considering processing accuracy (Refer to Unexamined Patent Publication No. 11-74499).

To solve the problem, as one example, a use of shallow trench isolation (STI) is proposed. The shallow trench isolation excels in microfabrications, and therefore, is expected to be suitable for separating miniaturized pixel cells.

However, the shallow trench isolation causes crystal defects due to process damages occurring in a manufacturing method and stresses of a silicon oxide film that is implanted in a trench. When electrons generated due to crystal defects enter into the photo diode, image defects such as dark currents and white scratches are generated.

To overcome this problem, a method of forming an impurity area of a reverse conductivity type to a photo diode (hereafter, simply referred to as the "impurity area") has been created on one side of a photo diode that is connected to a trench. With this arrangement, it is possible to prevent unwanted electrons from entering into a photo diode.

However, forming an impurity area causes a diminishment of saturation characteristics and sensitivity characteristics. This problem is common in pixel cells whose size is 2.2 μm square or smaller. Therefore, solid-state imaging devices that comprise 2.2 μm square pixel cells have not been realized.

SUMMARY OF THE INVENTION

The object of the present invention, which has been made in view of the afore mentioned problem, is to provide a solid-state imaging device that comprises pixel cells that are miniaturized without diminishing saturation characteristics and sensitivity characteristics, and a manufacturing method of the solid-state imaging device.

In order to achieve the object, a solid-state imaging device of the present invention comprises: a semiconductor substrate; and a well of a first conductivity type that is formed in the semiconductor substrate and is divided into a plurality of pixel cells by a trench to isolate the pixel cells from each other, the trench forming a lattice pattern in plan view, and each pixel cell having an electric charge accumulating area, a surface area, a highly concentrated area, and a boundary area, wherein the electric charge accumulating area is of a second conductivity type, the surface area is of the first conductivity type, is located between a surface of the pixel cell and the electric charge accumulating area, and contacts the electric charge accumulating area, the highly concentrated area is of the first conductivity type, is highly concentrated by addition of an impurity of the first conductivity type, and is located along a trench surface, and the boundary area is of the second conductivity type, contacts the highly concentrated area, the surface area, and the electric charge accumulating area, and separates the highly concentrated area from the electric charge accumulating area, an impurity concentration in the boundary area being higher than an impurity concentration in the electric charge accumulating area.

With this structure, by providing boundary areas, an electric charge accumulating area (photo diode) that is reduced in size because of a formation of a highly concentrated area (defect control layer) is recovered. Consequently, it is possible to resolve a problem of saturation characteristics and sensitivity characteristics due to reduction in size of a photo diode, and to miniaturize pixel cells of the solid-state imaging device.

In this case, it is preferable that a maximum value of an impurity concentration in the boundary area is at least twice as high as a maximum value of an impurity concentration in the electric charge accumulating area.

The present invention is a manufacturing method of a solid-state imaging device comprising: a first process of forming a well of a first conductivity type on a silicon substrate; a second process of forming a trench in the well; a third process of forming a silicon oxide film on an internal surface of the trench; a fourth process of forming a highly concentrated area of the first conductivity type along a trench surface; a fifth process of forming an electric charge accumulating area of the second conductivity type such that the electric charge accumulating area is adjacent to the highly concentrated area; and a sixth process of forming a boundary area of the second conductivity type such that the boundary area isolates the highly concentrated area and the electric charge accumulating area from each other.

With this method, after a highly concentrated area (defect control layer) is provided, a boundary area of a same conductivity type as a photo diode that includes a part of the highly concentrated area is formed. Therefore, it is possible to resolve a problem of saturation characteristics and sensitivity characteristics due to reduction in size of a photo diode, and to miniaturize pixel cells of the solid-state imaging device.

In this case it is acceptable that, in the second process, the trench is formed by etching; in the third process, the silicon oxide film is formed by thermal oxidation; in the fourth process, the highly concentrated area is formed by implanting ions of an impurity of the first conductivity type; in the fifth process, the electric charge accumulating area is formed by implanting ions of an impurity of the second conductivity type; and in the sixth process, the boundary area is formed by implanting ions of an impurity of the second conductivity type.

In this case, it is preferable that, in the sixth process, a maximum value of an impurity concentration in the boundary area is at least twice as high as a maximum value of an impurity concentration in the electric charge accumulating area.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes embodiments of a solid-state imaging device of the present invention and a manufacturing technique of it with reference to the attached figures.

[1] General Structure of the Solid-State Imaging Device

Figure 1:
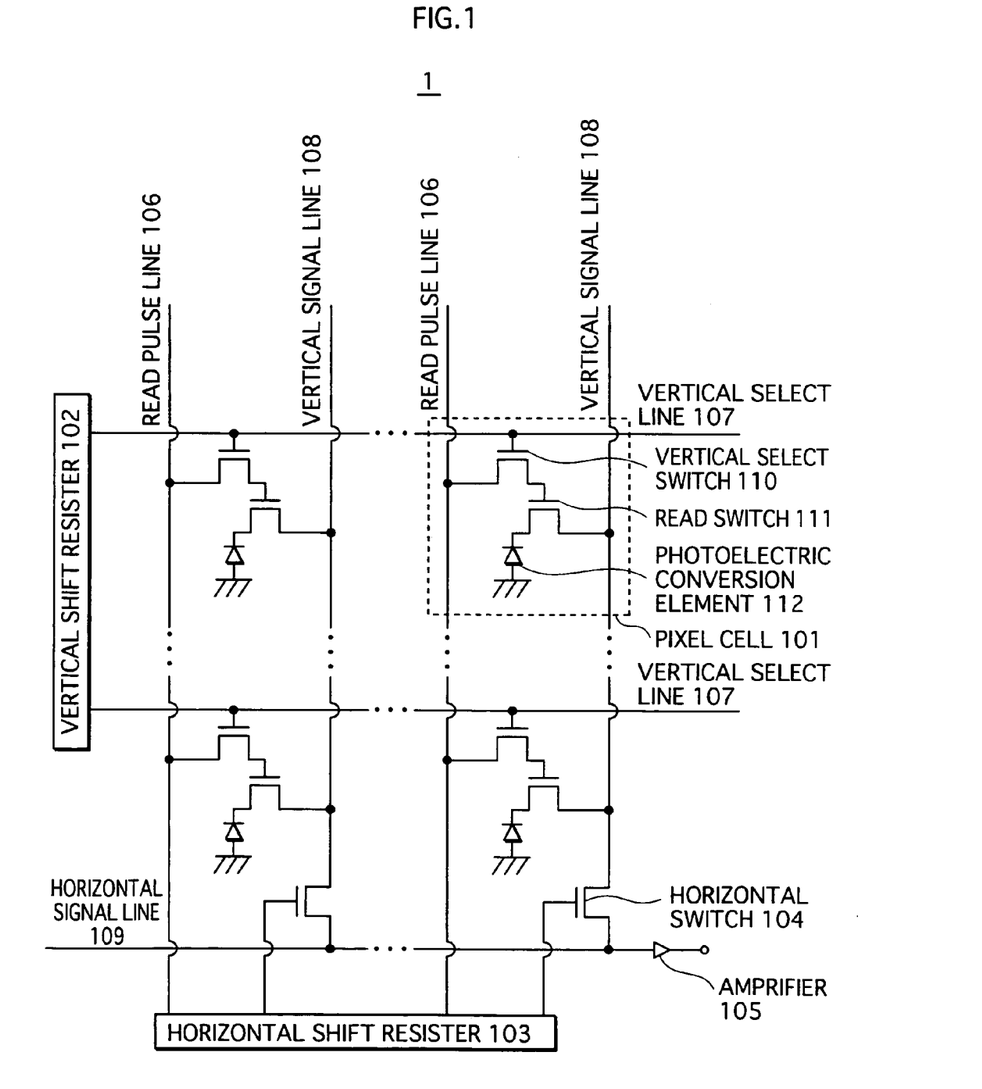
FIG. 1 is a circuit diagram that shows a general structure of the solid-state imaging device of the present invention.

The following describes a general structure of the solid-state imaging device of this embodiment. FIG. 1 is a circuit diagram that shows a general structure of the solid-state imaging device of the present invention.

As shown in FIG. 1, the solid-state imaging device comprises pixel cells 101, a vertical shift resister 102, a horizontal shift resister 103, horizontal switches 104, and amplifier 105, and these components are connected with each other by read pulse lines 106, vertical select lines 107, vertical signal lines 108, and horizontal signal lines 109. Here, each pixel cell 101 has a vertical select switch 110, a read switch 111, and a photoelectric conversion element 112, and a cell size is 2.2 µm square. The pixel cells 101 are arranged in a matrix and make up an imaging area.

In the matrix of the pixel cells 101, pixel cells 101 in each row share the vertical select line 107, and are each connected to the vertical select line 107 by a control electrode of the vertical select switch 110. The vertical shift resister 102 inputs, through the vertical select line 107, a vertical scanning pulse to the control electrode of the vertical select switch 110.

Also, in the matrix of the pixel cells 101, pixel cells 101 in each column share the vertical signal line 108, and are each connected to the vertical signal line 108 by one of a main electrodes of the read switch element 111. The other main electrode of the read switch 111 is connected to the photo electric conversion element 112.

Further, in the matrix of the pixel cells 101, pixel cells 101 in each column share the read pulse line 106, and are each connected to the read pulse line 106 by one of main electrodes of the vertical select switch 110. The other main electrode of the vertical select switch 110 is connected to a control electrode of the read switch 111.

One of main electrodes of the horizontal switch 104 is connected to the vertical signal line 108, and the other main electrode is connected to the horizontal signal line 109. A control electrode of the horizontal switch 104 is input horizontal scanning pulse from the horizontal signal circuit 103.

The amplifier 105 amplifies and outputs a signal charge of the horizontal signal line.

Here, when a vertical scanning pulse is input from the vertical shift resister 102 and a read pulse is input from the horizontal shift resister 103, the vertical select switch 110 inputs a pulse as a product of the input pulse to the control electrode of the read switch 111 to cause a signal charge generated as a result of a photoelectric conversion by the photoelectric conversion element 112 to be output to the vertical signal line 108.

After the horizontal shift resister 103 inputs a horizontal scanning pulse to the horizontal switch 104 and also inputs a horizontal read pulse to the read pulse line 106, the signal charge that is output to the vertical signal line 108 is transmitted to the horizontal signal line 109, and is amplified and output by the amplifier 105.

It should be noted here that the structure of the pixel cell 101 is not limited to the above, and the pixel cell 101 may have other structures.

[2] Structure of an Imaging Area of the Solid-State Imaging Device 1

Figure 2:
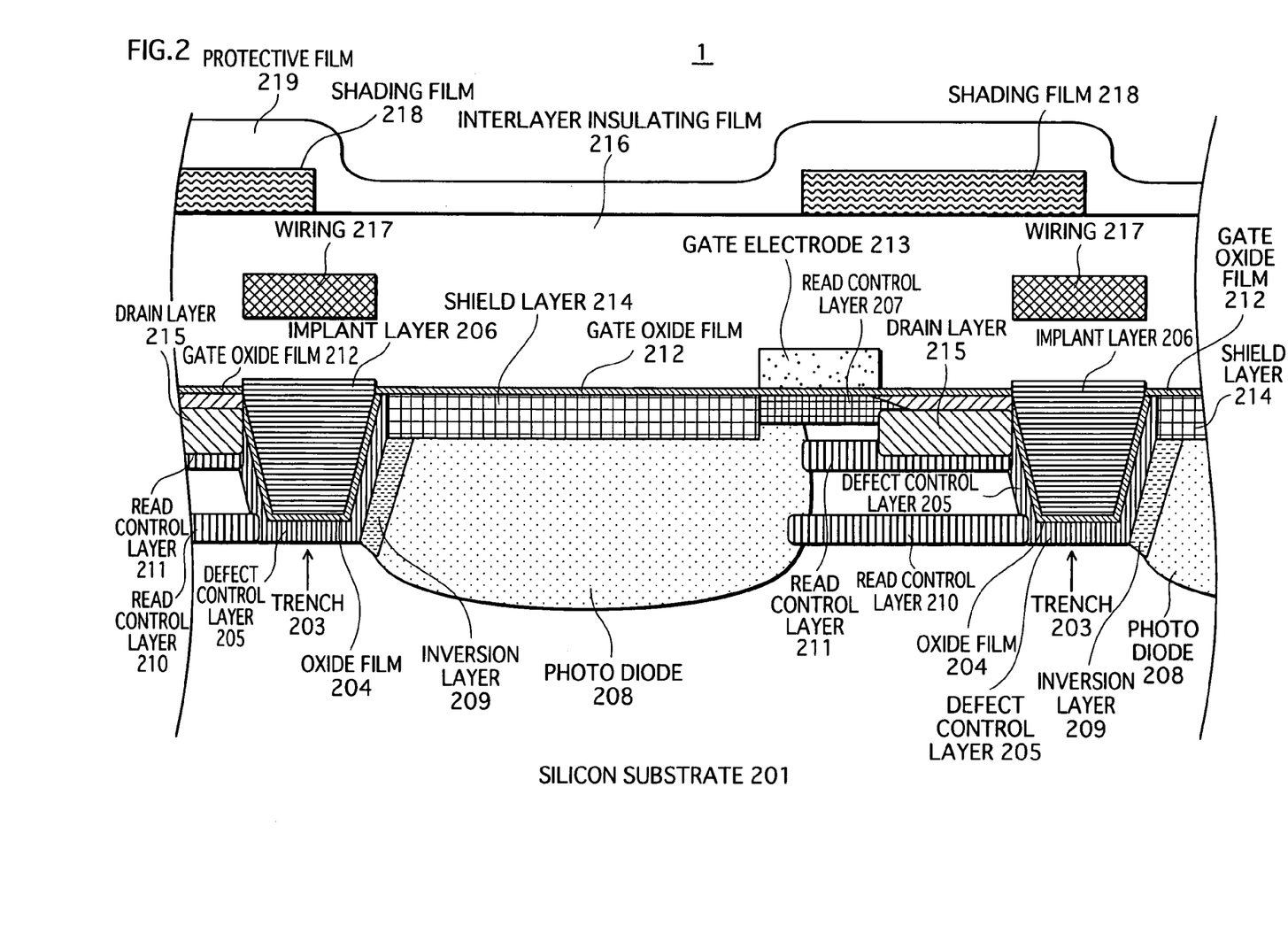
FIG. 2 is a sectional view that shows a structure of an imaging area of the solid-state imaging device of the present invention.

The following describes a general structure of an imaging area made up by the pixel cells 101 of the slid-state imaging device 1. FIG. 2 is a sectional-view that shows a structure of an imaging area of the solid-state imaging device 1. As shown in FIG. 2, the solid-state imaging device 1 comprises a silicon substrate 201 in which photo diodes 208 and trenches 203 are formed. The silicon substrate 201 comprises an N-type semiconductor substrate in which a P-type well is formed. Here, in FIG. 2, only the P-type well part is indicated and the N-type part is omitted.

The photo diode 208 is an N-type semiconductor layer, and a shield layer 214 is provided on a surface of the photo diode 208. The photo diode 208 is a so-called implantable photo diode and makes up the photoelectric conversion element 112. With this structure, the photo diode 208 is blocked from defects on a surface of the silicon substrate 201, and it is possible to prevent a leakage current due to defects on a surface of the silicon substrate 201 from occurring. A size of the photo diode 208 is 1.7 µm by 1.1 µm in a plan view.

An oxide film 204 is formed on an internal surface of the trench 203. The trench 203 isolates pixel cells. The trench 203 is 0.35 µm in width and 0.33 µm in depth. The trench forms lattice pattern in plan view. As will be described later, the trench 203 is formed by a dry etching, and this causes the silicon substrate 201 to be damaged by plasmas. Also, when the oxide film 204 is formed, stresses are generated between the oxide film 204 and the silicon substrate 201.

As a result, lattice defects occur around the trench 203, and electrons are generated from these lattice defects because of heat disturbances and enter into the photo diode 208. This causes false signals to occur, and diminishes image quality. In regard to this problem, a defect control layer 205 is a dense P-type semiconductor layer, and by combining the electrons described above with the holes, it prevents the electrons from entering into the photo diode 208.

As described above, the defect control layer 205 is a dense P-type semiconductor layer, and if P-type carriers enter into the photo diode 208 because of thermal diffusion in a manufacturing method of the solid-state imaging device, the photo diode 208 is reduced in size. This decreases the number of the electric charges that can be stored in the photo diode 208 and diminishes image quality. An inversion layer 209 is a dense N-type semiconductor layer and prevents P-type carriers from diffusing into the photo diode 208 in a manufacturing process. The inversion layer 209 includes a highly concentrated N-type area generated by inverting a highly concentrated P-type area that is generated when the defect control layer 205 is formed.

Read control layers 207, 210, and 211, a gate oxide film 212, a gate electrode 213, and a drain layer 215 make up the read switch 111. A wiring 217 reads electric charges stored in the photo diode 208. An interlayer insulating film 216 is an insulating member that has a high transparency in terms of visible radiation. Shading areas 218 shade photo diodes 208 thereunder that are not to receive light so that light enters only into the desired photo diodes 208. A protective film 219 also has a high transparency in terms of visible radiation, and protects the shading films 218, and the interlayer insulating film 216 and others.

[3] Manufacturing Method of the Solid-State Imaging Device 1

The following describes a manufacturing method of the solid-state imaging device 1. FIGS. 3A to 7B are sectional views of the solid-state imaging device 1 in a manufacturing process.

Figure 3A:
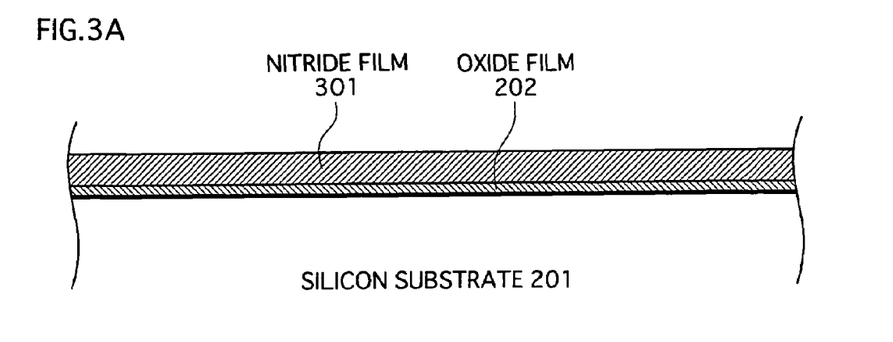
FIG. 3A to FIG. 3C are sectional views of the solid-state imaging device of the present invention in a manufacturing method.

As shown in FIG. 3A, first, a siliconoxide film (hereafter, simply referred to as the "oxide film") 202 is formed on a silicon substrate 201 by thermal oxidation. Next, a silicon nitride film (in other words, SiN film, and hereafter simply referred to as the "nitride film") 301 is formed on the oxide film 202 by low pressure chemical vapor deposition (LPCVD). The oxide film 202 is 10 nm and the nitride film 301 is 150 nm in thickness.

The low pressure chemical vapor deposition (LPCVD) is a technique in which one or more kinds of chemical compound gases and simple gases including an element that makes up a thin film to be formed are provided on a wafer that has been heated up and is under reduced pressure of approximately 0.1 to 10 Torr so that chemical reactions grow the thin film.

Then, a resist 302 is formed on the nitride film 301 as follows. A resist agent is applied on the nitride film 301. After the resist agent is heat-treated (pre-baked), it is exposed by a lithography apparatus such as a stepper, is developed using an organic solvent, and is heat-treated again (post-baked) and the resist 302 is completed.

Figure 3B:
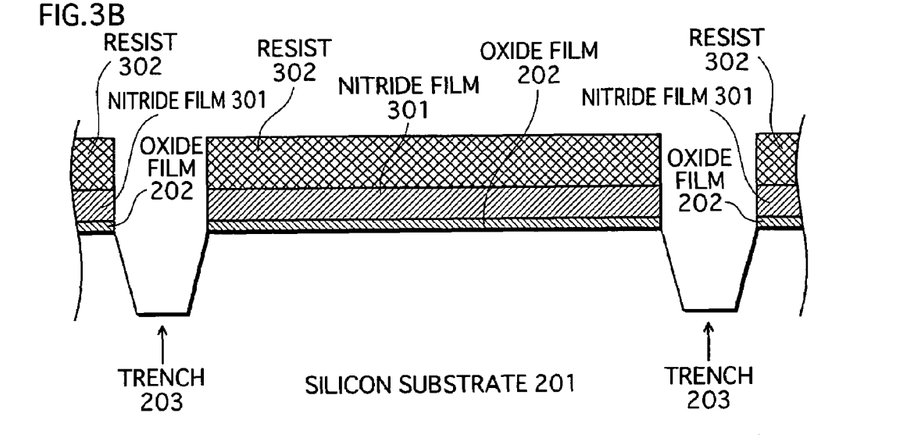

Then, a trench 203 is formed by excavating parts of the nitride film 301, the oxide film 202, and the silicon substrate 201 that are not covered by the resist 302, by etching process (FIG.3B). In this case, the etching process may employ dry etching or wet etching.

Figure 3C:
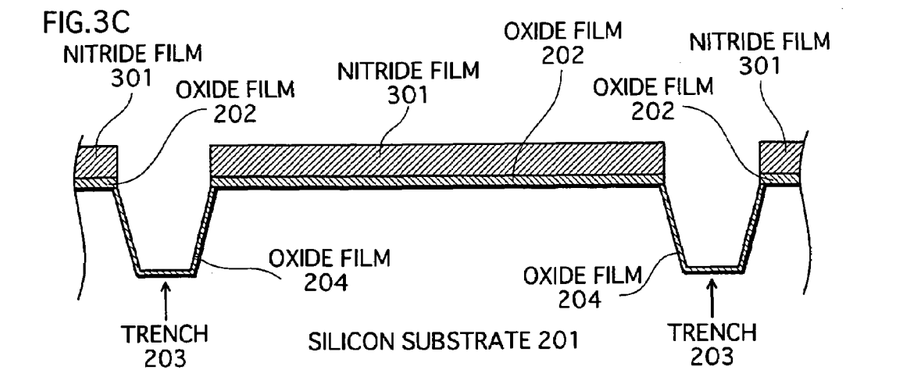

After the resist 302 is removed, an oxide film 204 is formed by thermally oxidizing an internal wall of the trench 203 by heat treatment (FIG. 3C). A film thickness of the oxide film 204 is 15 nm.

Figure 4A:
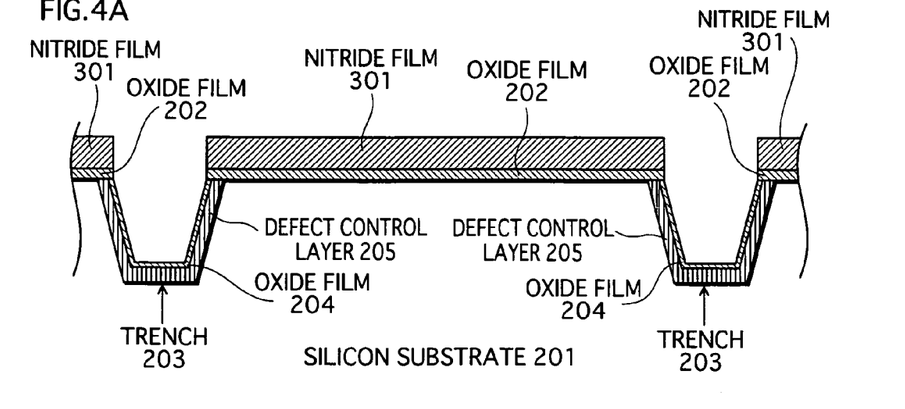
FIG. 4A to FIG. 4C are sectional views of the solid-state imaging device of the present invention in a manufacturing method subsequent to the process shown in FIG. 3C.

Then, a defect control layer 205 is formed by implanting ions of boron(B) from four directions by turns with an acceleration energy of 30 keV and at a tilt angle of 25 degrees, where $8.0 \times 10^{12}$ ions/cm$^2$ of boron is implanted from each direction (FIG. 4A). Here, the tilt angle denotes an angle between an ion being implanted and a normal to a main surface. Also, implanting ions from four directions by turns denotes that ions are implanted toward the main surface of silicon substrate 201 from four directions that are separated by 90 degrees from each other when viewed from top. With this arrangement, the internal surface of the trench 203 is covered in entirety by the defect control layer 205 without making so-called shaded parts.

Figure 4B:
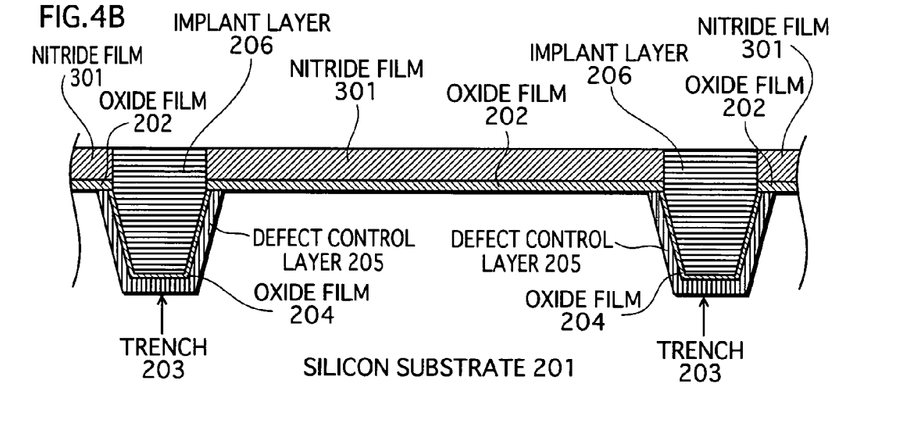
Figure 4C:
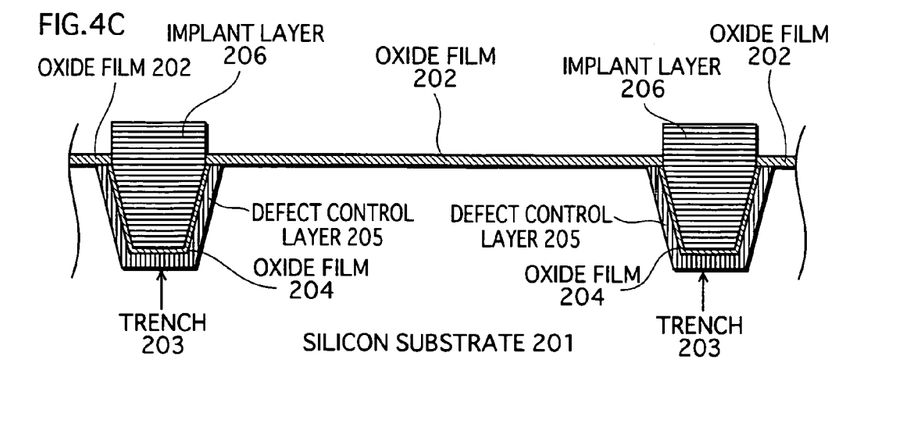

Then, an implant layer 206 is formed by depositing a silicon oxide on the entire surface of the silicon substrate 201. The silicon oxide other than the implant layer 206 is removed and the surface is smoothed using a chemical mechanical polishing (CMP) (FIG. 4B). Further, the nitride film 301 is removed (FIG.4C).

Figure 5A:
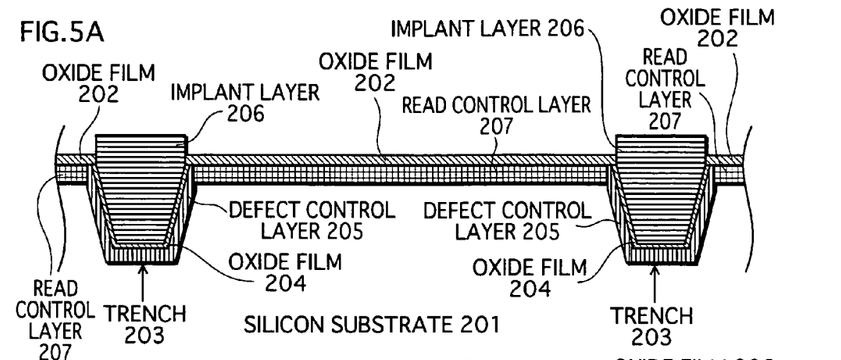
FIG. 5A to FIG. 5C are sectional views of the solid-state imaging device of the present invention in a manufacturing method subsequent to the process shown in FIG. 4C.

The read control layer 207 is formed by implanting $1.0 \times 10^{12}$ ions/cm$^2$ of boron with an acceleration energy of 10 keV (FIG. 5A).

Figure 5B:
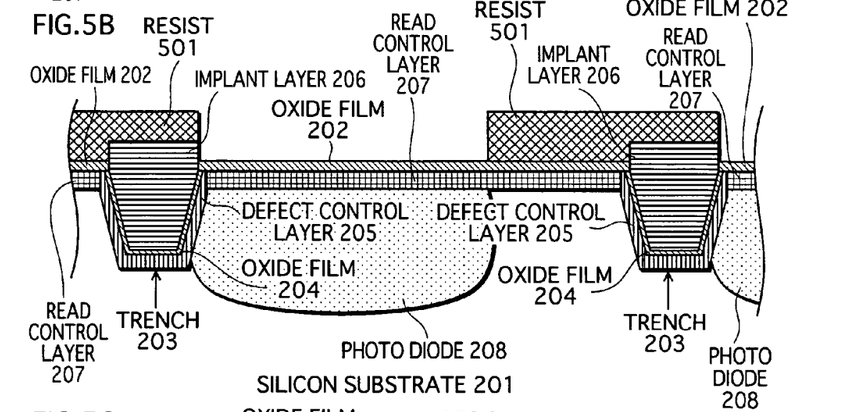

After a resist 501 is formed on the oxide film 202 and the implant layer 206, a photo diode 208 is formed by implanting $2.0 \times 10^{12}$ ions/cm$^2$ of arsenic(As) with an acceleration energy of 600 keV (FIG. 5B).

Figure 5C:
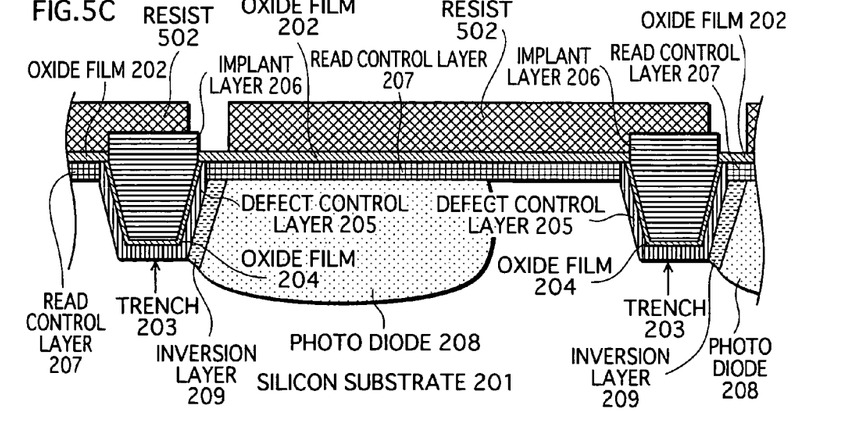

After the resist 501 is removed, a resist 502 is formed on the oxide film 202 and the implant layer 206, and an inversion layer 209 is formed by implanting $2.0 \times 10^{12}$ ions/cm$^2$ of arsenic with an acceleration energy of 600 keV (FIG. 5C).

Figure 6A:
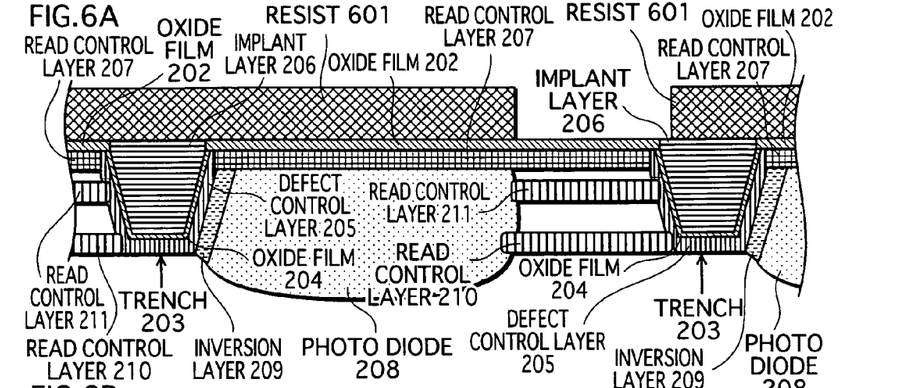
FIG. 6A to FIG. 6C are sectional views of the solid-state imaging device of the present invention in a manufacturing method subsequent to the process shown in FIG. 5C.

Then, after the resist 502 is removed, a resist 601 is formed. First, a read control layer 210 is formed by implanting $4.0 \times 10^{11}$ ions/cm$^2$ of boron with an acceleration energy of 300 keV. Then, a read control layer 211 is formed by implanting $8.0 \times 10^{11}$ ions/cm$^2$ of boron with an acceleration energy of 100 keV (FIG.6A).

Figure 6B:
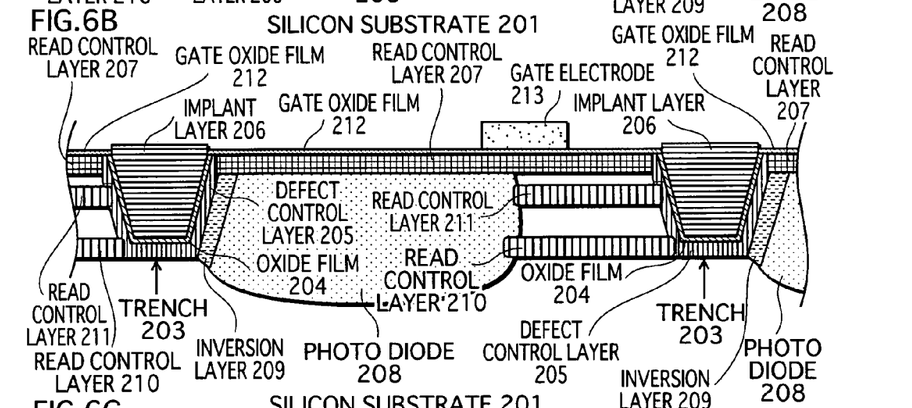

After the resist 601 is removed, the read control layer 207 is exposed by removing the oxide film 202 by etching process. A gate oxide film 212 and then a gate electrode 213 are formed on the read control layer 207 (FIG. 6B).

Figure 6C:
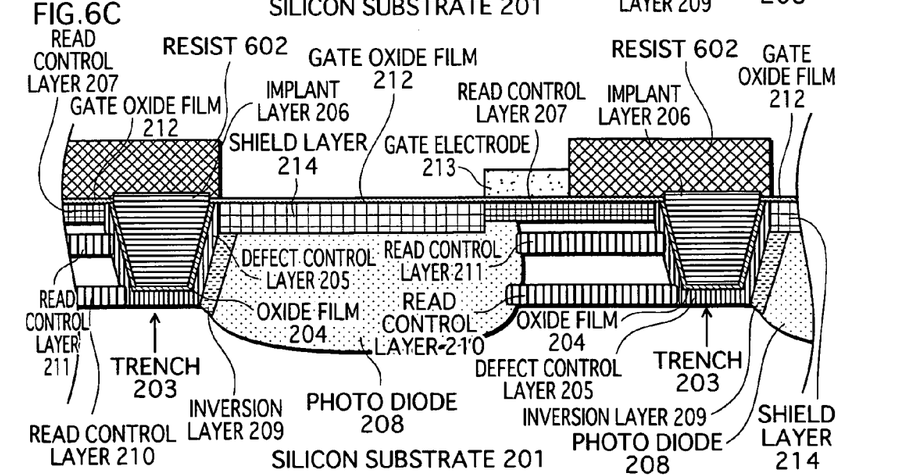

Then, a resist 602 is formed, and a shield layer 214 is formed by implanting $1.0 \times 10^{14}$ ions/cm$^2$ of boron with an acceleration energy of 6 keV (FIG. 6C).

Figure 7A:
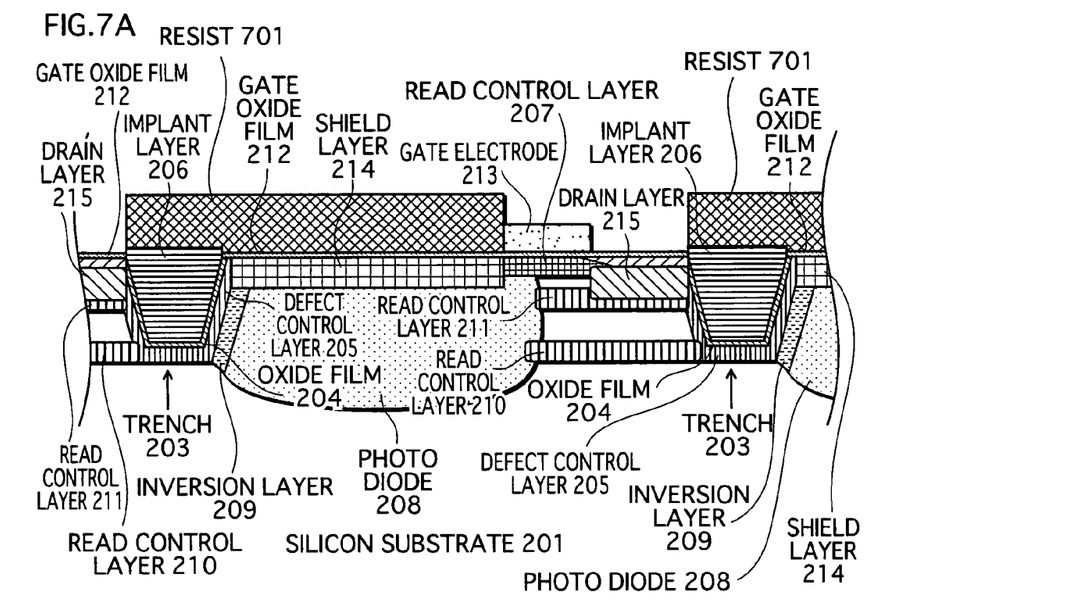
FIG. 7A to FIG. 7B are sectional views of the solid-state imaging device of the present invention in a manufacturing method subsequent to the process shown in FIG. 6C.

The resist 602 is removed and a resist 701 is formed. Then a drain layer 215 is formed by implanting $4.0 \times 10^{13}$ ions/cm$^2$ of phosphorus(P) with an acceleration energy of 50 keV, and further by implanting $2.0 \times 10^{12}$ ions/cm$^2$ of boron with an acceleration energy of 30 keV (FIG. 7A).

Figure 7B:
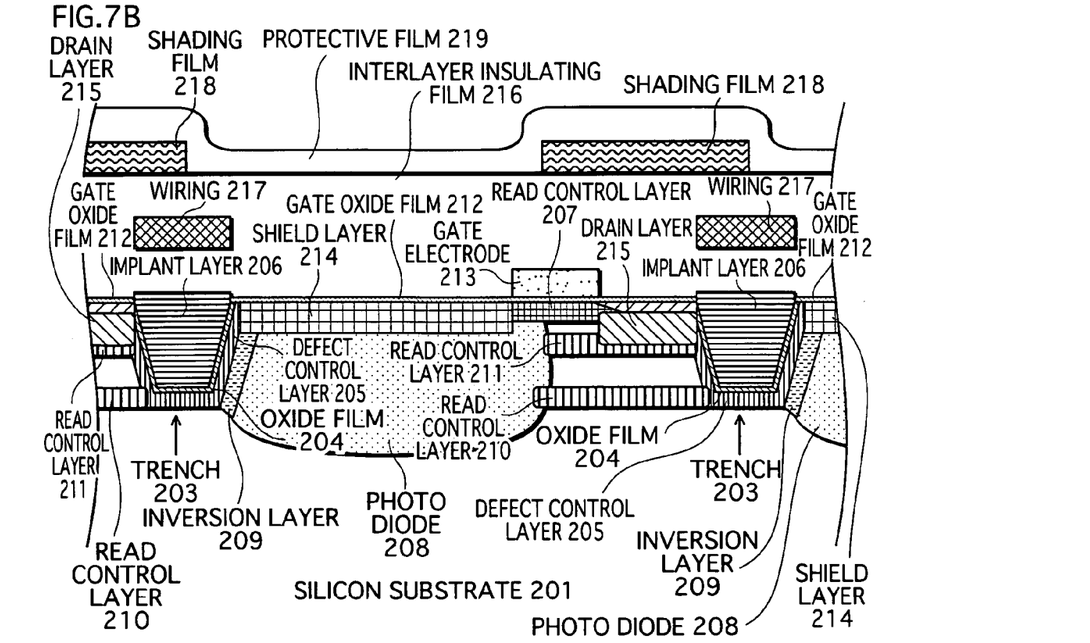

After the resist 701 is removed, an interlayer insulating film 216, a wiring 217, a shading film 218, and a protective film 219 are formed in wiring process (FIG. 7B).

[4] Impurity Profile

Figure 8:
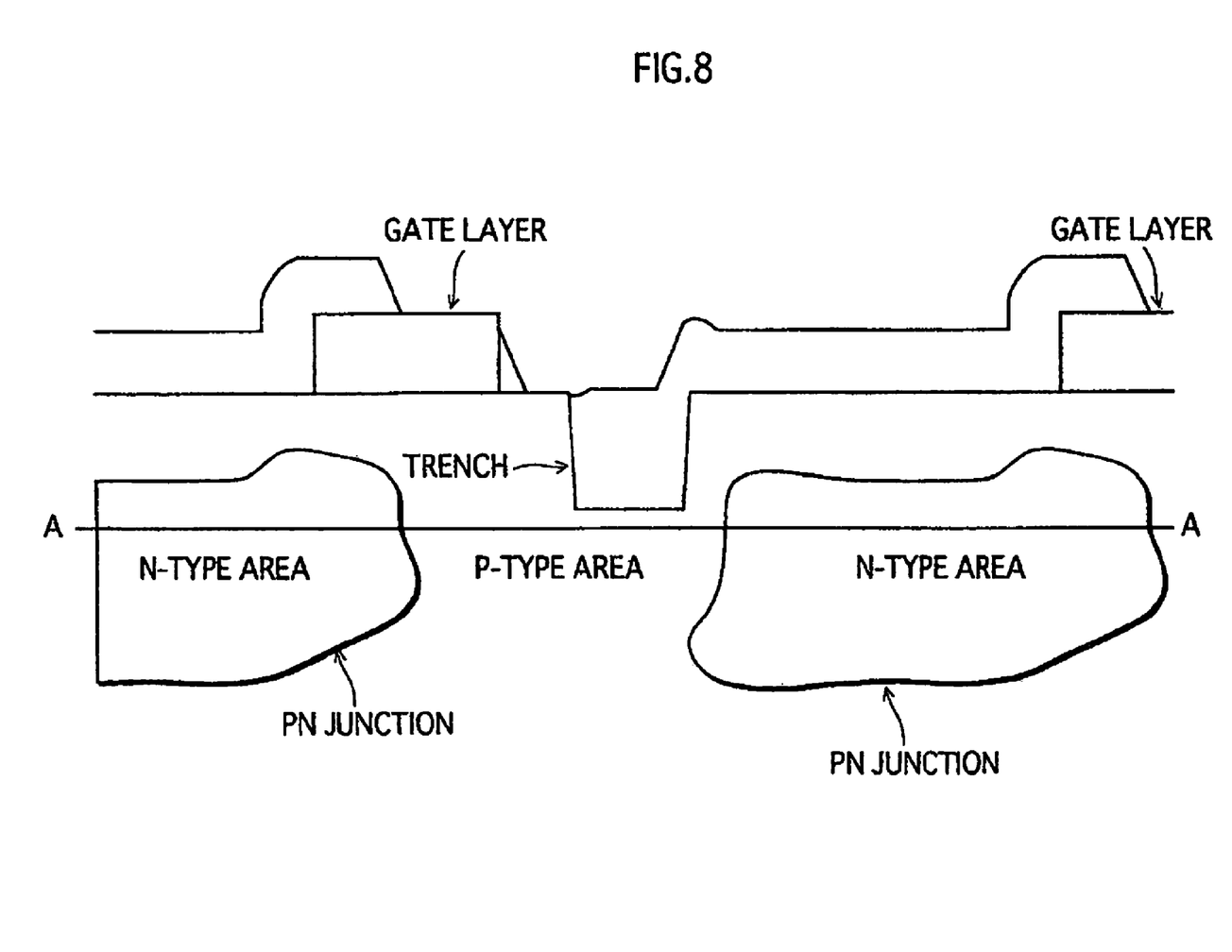
FIG. 8 is a sectional view that shows a distribution of impurities in the solid-state imaging device 1 including a trench.
Figure 9:
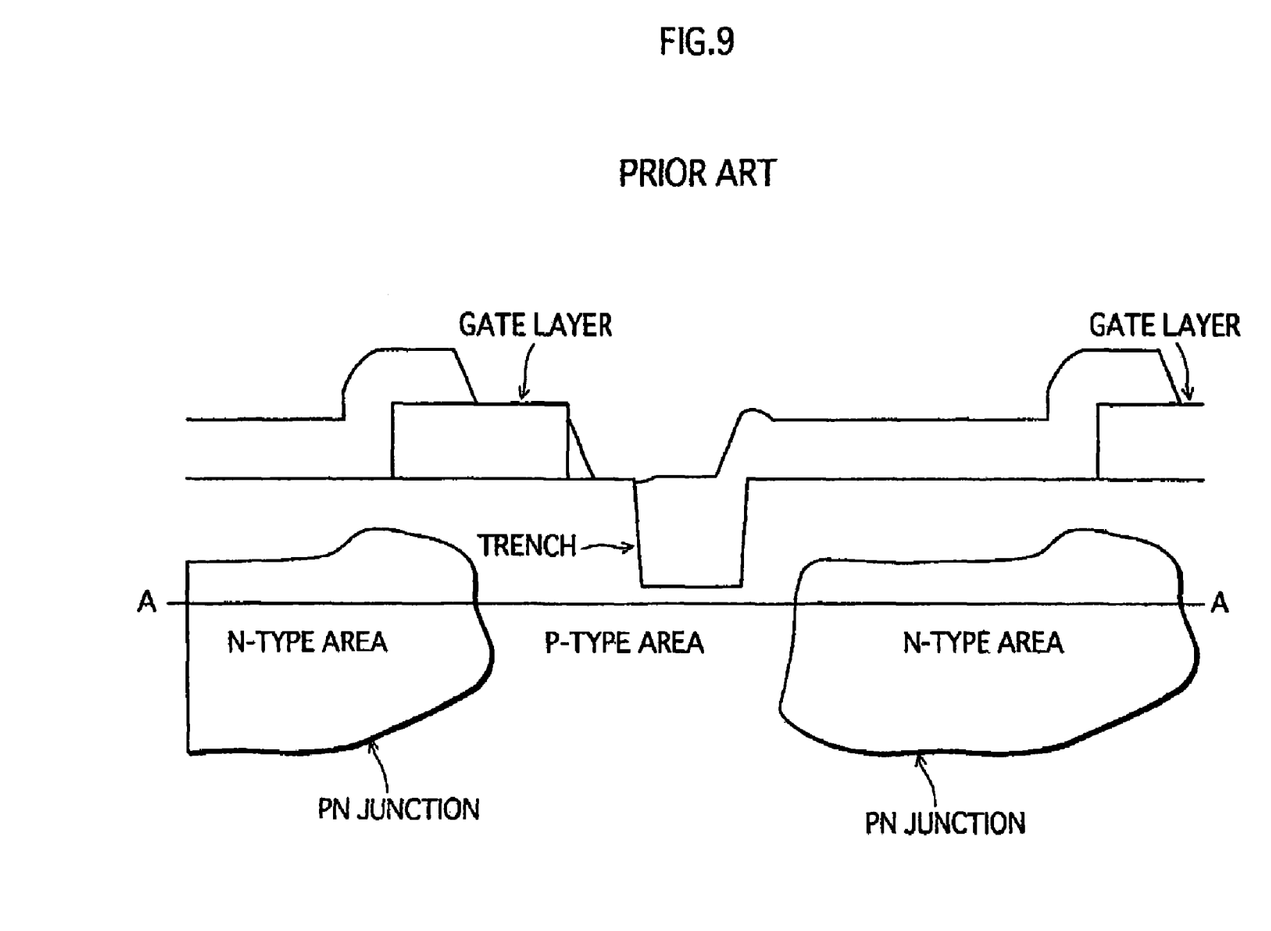
FIG. 9 is a sectional view that shows a distribution of impurities in the conventional solid-state imaging device.

The following explains an impurity profile of the solid-state imaging device 1. FIG. 8 is a sectional view that shows a distribution of impurities in the solid-state imaging device 1, including the trench 203. As shown in FIG. 8, the photo diode 208 is an N-type area, and a boundary between the photo diode 208 and a P-type area surrounding the photo diode 208 is a PN junction. FIG. 9 is a sectional view that shows a distribution of impurities in the conventional solid-state imaging device that does not have an inversion layer 209. As can be seen from a comparison between FIG. 8 and FIG. 9, the N-type area of the solid-state imaging device 1 in FIG. 8 is extended toward the trench 203.

Figure 10:
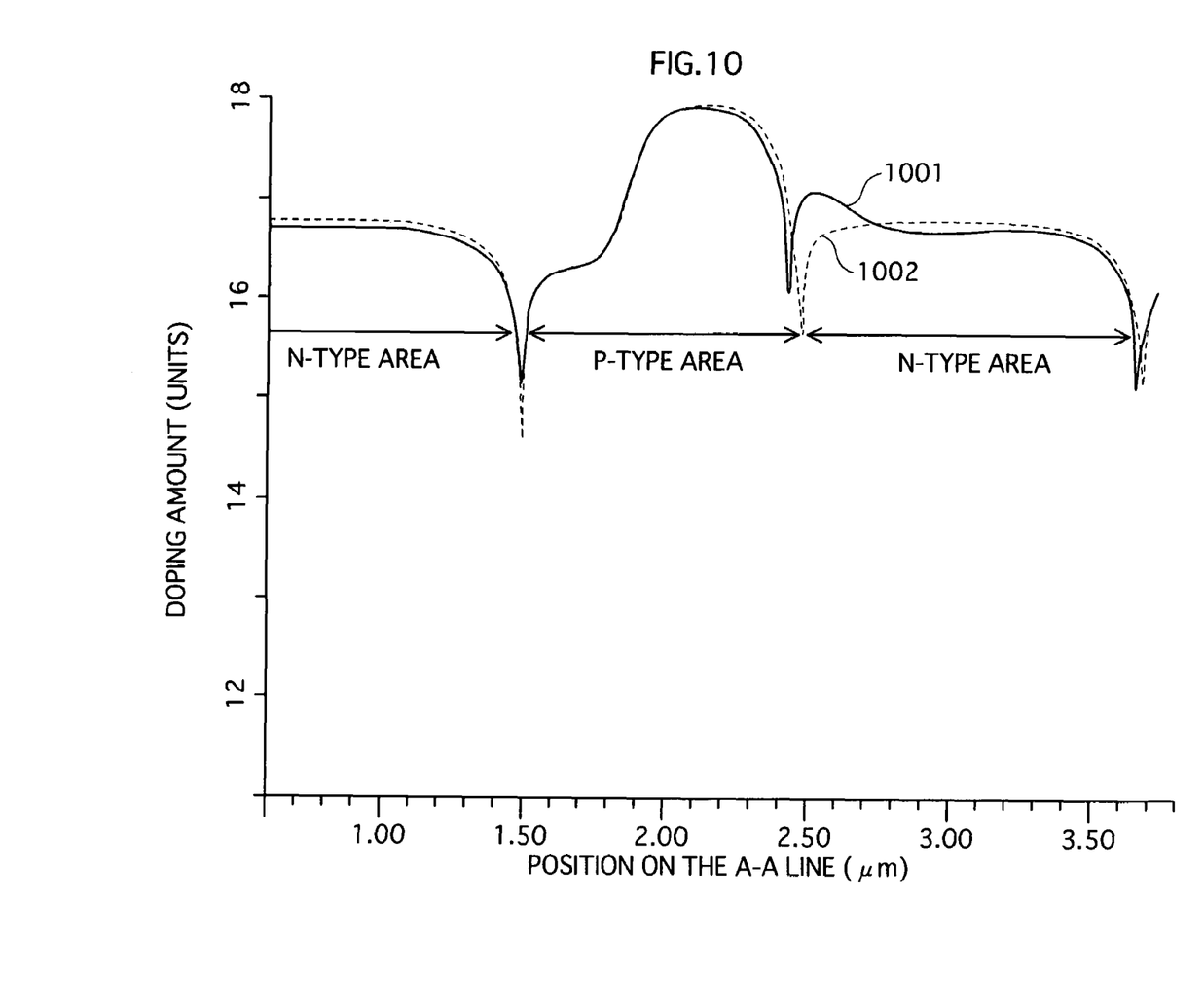
FIG. 10 is a graph that shows a distribution of a doping amount on the A-A line shown in FIG. 8 and FIG. 9.

The following explains a concentration distribution of the impurities on A-A lines shown in FIGS. 8 and 9. FIG. 10 is a graph that shows a distribution of a doping amount on the A-A lines. In the FIG.10, a vertical axis shows a doping amount regardless of an N-type area or a P-type area, and a horizontal axis shows positions on the A-A line. A graph 1001 shows a distribution of a doping amount of the solid-state imaging device 1, and a graph 1002 shows a distribution of a doping amount of the conventional solid-state imaging device.

As shown in FIG. 10, in the solid-state imaging device 1, a doping amount is high in a part close to the trench 203 of the N-type area. This part is the inversion layer 209. On the other hand, a doping amount in the conventional solid-state imaging device remains constant except that a doping amount becomes low at a part close to a boundary between the N-type area and the P-type area.

Also, the P-type areas of the solid-state imaging device 1 in FIG. 8 and the conventional solid-state imaging device in FIG. 9 almost overlap each other, and in the part that shows the P-type area in the FIG. 10, values of the graphs 1001 and 1002 are almost the same. Therefore, concentration profiles of the defect control layers of the solid-state imaging device 1 and the conventional solid-state imaging device are almost the same. That means the solid-state imaging device 1 has the same capability as the conventional solid-state imaging device to prevent electrons generated due to lattice defects from entering into the photo diode.

As described above, the inversion layer 209 is formed by implanting ions of arsenic. Therefore, whether a solid-state imaging device has an inversion layer 209 or not is indicated by a concentration distribution of arsenic on the A-A line.

Figure 11:
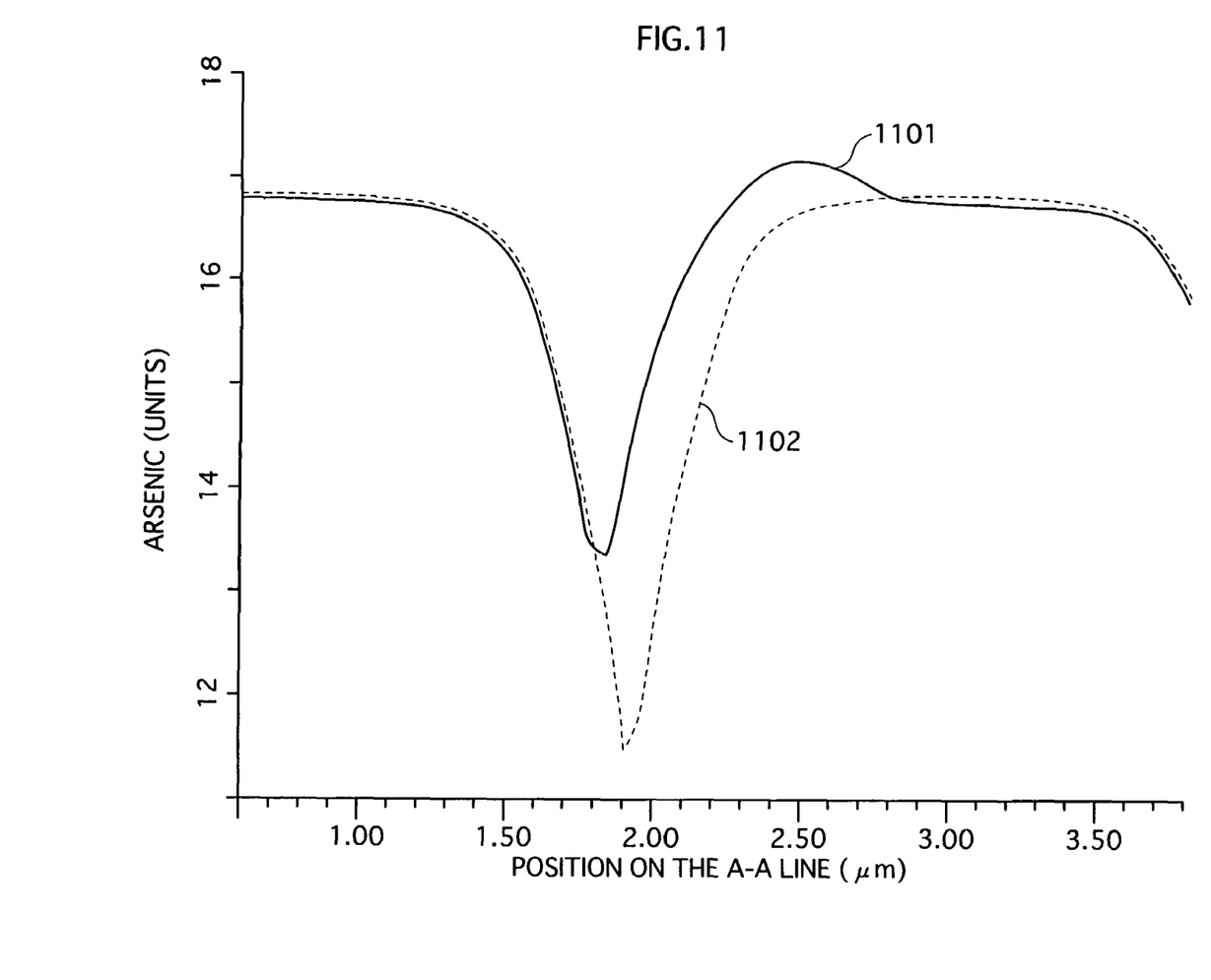
FIG. 11 is a graph that shows a concentration distribution of arsenic on the A-A line shown in FIG. 8 and FIG. 9.

FIG. 11 is a graph that shows a concentration distribution of arsenic on the A-A line. In the FIG. 11, a vertical axis shows a concentration of arsenic, and a horizontal axis shows positions on the A-A line. A graph 1101 shows a concentration distribution of arsenic of the solid-state imaging device 1, and a graph 1102 shows a concentration distribution of arsenic of the conventional solid-state imaging device.

As shown in FIG. 11, in a part of the N-type area that is close to the boundary between the P-type area and the N-type area, a concentration of arsenic in the solid-state imaging device 1 is higher than the conventional solid-state imaging device, which implies the presence of the inversion layer.

[5] Modification Example

Although the present invention is described based on the preferred embodiment as above, the present invention should not be limited to the above embodiment. For example, the following modifications are possible.

(1) In the embodiment above, a silicon substrate 201 in which a P-typewell is formed in an N-type semiconductor substrate is used, and a photo diode 208 is an N-type area and a defect control layer 205 is a P-type area. However, the present invention should not be limited to this, and it is acceptable to reverse a conductivity type of each part that makes up the solid-state imaging device. Even if the solid-state imaging device has this structure, it is possible to prevent a photo diode from being reduced in size when a defect control layer is formed, as same as the embodiment above.

(2) In the embodiment above, an inversion layer 209 is formed by implanting ions of arsenic into the part where a photo diode 208 has been formed so that an inversion layer 209 overlaps on a photo diode 208. However, the present invention is not limited to this, and the following modification is possible.

It is possible to form an inversion layer 209 so that only one part of the inversion layer 209 overlaps on a photo diode 208, without forming the photo diode 208 in an entire area where an inversion layer 209 is to be formed. Even if a solid-state imaging device has this structure, a solid-state imaging device has the same effect as the solid-state imaging device described in the above embodiment as long as the same impurity profile is obtained.

(3) In the embodiment above, a size of a pixel cell is 2.2 μm square. However, the present invention is not limited to this, and a pixel call can be varied in size. Especially, when a pixel cell is smaller than 2.2 μm square such as 1.5 m square, saturation characteristics and sensitivity characteristics can be diminished as described earlier, and in this case, the present invention is effective.

Also, sizes of the photo diode and the trench are respectively one example, and the photo diode and the trench may have other sizes.

(4) In the embodiment above, an explanation is provided only on a case where an inversion layer 209 is formed by implanting arsenic. However, the present invention is not limited to this, and it is possible to form an inversion layer 209 by implanting ions of other material.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be constructed as being included therein.

What is claimed is:

1. A solid-state imaging device comprising:
   a semiconductor substrate; and
   a well of a first conductivity type that is formed in the semiconductor substrate and is divided into a plurality of pixel cells by a trench to isolate the pixel cells from each other, the trench forming a lattice pattern in plan view, and each pixel cell having a photo diode, a shield layer, a defect control layer, and an inversion layer, wherein
   the photo diode is of a second conductivity type,
   the shield layer is of the first conductivity type, is located between a surface of the pixel cell and the photo diode, and contacts the photo diode,
   the defect control layer is of the first conductivity type, is highly concentrated by addition of an impurity of the first conductivity type, and is located along a trench surface, and
   the inversion layer is of the second conductivity type, contacts the defect control layer, the shield layer, and the photo diode, and separates the defect control layer from the photo diode, an impurity concentration in the inversion layer being higher than an impurity concentration in the photo diode.

2. The solid-state imaging device of claim 1, wherein a maximum value of an impurity concentration in the inversion layer is at least twice as high as a maximum value of an impurity concentration in the photo diode.

\* \* \* \* \*